(12) United States Patent
Eller et al.

(10) Patent No.: US 9,209,088 B2
(45) Date of Patent: Dec. 8, 2015

(54) SEMICONDUCTOR DEVICES AND METHODS OF MANUFACTURE THEREOF

(75) Inventors: Manfred Eller, Wappingers Falls, NY (US); Jin-Ping Han, Fishkill, NY (US)

(73) Assignee: Infineon Technologies AG, Neubiberg (DE)

( * ) Notice: Subject to any disclaimer, the term of this patent is extended or adjusted under 35 U.S.C. 154(b) by 1592 days.

(21) Appl. No.: 11/832,449

(22) Filed: Aug. 1, 2007

(65) Prior Publication Data
US 2009/0032841 A1 Feb. 5, 2009

(51) Int. Cl.
*H01L 21/3205* (2006.01)
*H01L 21/8238* (2006.01)
*H01L 29/78* (2006.01)
*H01L 29/66* (2006.01)

(52) U.S. Cl.
CPC ........ *H01L 21/823814* (2013.01); *H01L 21/823807* (2013.01); *H01L 29/6653* (2013.01); *H01L 29/6659* (2013.01); *H01L 29/66636* (2013.01); *H01L 29/7833* (2013.01); *H01L 29/7843* (2013.01); *H01L 29/7848* (2013.01); *H01L 29/665* (2013.01); *H01L 29/6656* (2013.01)

(58) Field of Classification Search
CPC ............... H01L 29/1083; H01L 21/823807; H01L 21/26586; H01L 21/823814; H01L 29/66659; H01L 29/1045; H01L 21/26513; H01L 29/0653; H01L 29/0847; H01L 29/7835; H01L 29/7833; H01L 21/2652; H01L 27/0922
USPC .......... 438/306, 285, 149, 131, 696; 257/190, 257/347
See application file for complete search history.

(56) References Cited

U.S. PATENT DOCUMENTS

| | | | |
|---|---|---|---|
| 6,504,214 B1* | 1/2003 | Yu et al. | 257/347 |
| 6,803,269 B2* | 10/2004 | Coolbaugh et al. | 438/224 |
| 2005/0056892 A1* | 3/2005 | Seliskar | 257/348 |
| 2005/0142768 A1* | 6/2005 | Lindert et al. | 438/285 |
| 2006/0115934 A1* | 6/2006 | Kim et al. | 438/149 |
| 2006/0145273 A1* | 7/2006 | Curello et al. | 257/410 |
| 2007/0054457 A1* | 3/2007 | Ueno et al. | 438/299 |
| 2007/0202651 A1* | 8/2007 | Zhang et al. | 438/296 |
| 2008/0299724 A1* | 12/2008 | Grudowski et al. | 438/257 |

* cited by examiner

*Primary Examiner* — Mark A Laurenzi
(74) *Attorney, Agent, or Firm* — Slater & Matsil, L.L.P.

(57) ABSTRACT

Semiconductor devices and methods of manufacture thereof are disclosed. In a preferred embodiment, a method of manufacturing a semiconductor device includes providing a semiconductor wafer, forming a gate dielectric over the semiconductor wafer, and forming a gate over the gate dielectric. At least one recess is formed in the semiconductor wafer proximate the gate and the gate dielectric, at least a portion of the at least one recess extending beneath the gate. The at least one recess in the semiconductor wafer is filled with a semiconductive material.

21 Claims, 5 Drawing Sheets

SEMICONDUCTOR DEVICES AND METHODS OF MANUFACTURE THEREOF

TECHNICAL FIELD

The present invention relates generally to the fabrication of semiconductor devices, and more particularly to the fabrication of transistors.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various layers using lithography to form circuit components and elements thereon.

A transistor is an element that is used frequently in semiconductor devices. There may be millions of transistors on a single integrated circuit (IC), for example. A common type of transistor used in semiconductor device fabrication is a metal oxide semiconductor field effect transistor (MOSFET), as an example. A transistor typically includes a gate dielectric disposed over a channel region in a substrate, and a gate electrode formed over the gate dielectric. A source region and a drain region are formed on either side of the channel region within the substrate.

Source and drain regions in some applications are formed by implanting dopants into the top surface of the substrate at an angle to form implantation regions beneath the gate electrode. However, the doping implantation process requires additional manufacturing steps in the process flow, thus increasing the time required to manufacture the transistors and increasing costs. Furthermore, dopant implantation is difficult to control and may deleteriously affect the stress of the source and drain regions in some applications, decreasing device performance.

Thus, what are needed in the art are improved methods of fabricating transistors and structures thereof.

SUMMARY OF THE INVENTION

These and other problems are generally solved or circumvented, and technical advantages are generally achieved, by preferred embodiments of the present invention, which provide novel methods of manufacturing semiconductor devices and transistors and structures thereof.

In accordance with a preferred embodiment of the present invention, a method of manufacturing a semiconductor device includes providing a semiconductor wafer, forming a gate dielectric over the semiconductor wafer, and forming a gate over the gate dielectric. At least one recess is formed in the semiconductor wafer proximate the gate and the gate dielectric, at least a portion of the at least one recess extending beneath the gate. The at least one recess in the semiconductor wafer is filled with a semiconductive material.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

Figure 1:
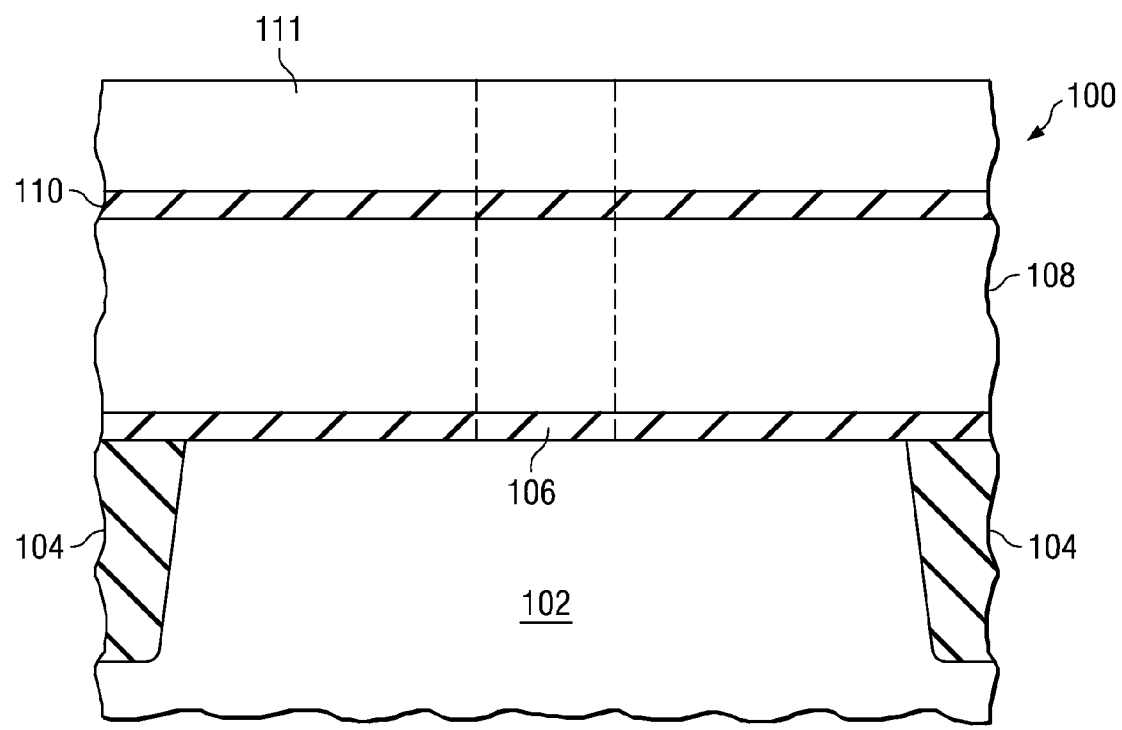
FIGS. 1 through 5 show cross-sectional views of a semiconductor device at various stages of manufacturing in accordance with a preferred embodiment of the present invention, wherein recessed source and drain regions of a transistor are filled with an in-situ doped compound semiconductor material.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in specific contexts, namely implemented in single transistor devices and CMOS two-transistor device applications. Embodiments of the invention may also be implemented in other semiconductor applications such as memory devices, logic devices, and other applications that utilize transistor devices, for example.

In some transistor applications, it is desirable to introduce stress in the channel region of the transistor in order to increase the mobility of semiconductor carriers such as electrons and holes. One method used to induce strain is the use of embedded SiGe (eSiGe), which involves creating a recess in the source and drain regions of a MOS transistor, and growing a SiGe film within the recess in lieu of conventional silicon source and drain regions. The larger crystal lattice of the eSiGe creates a stress in the channel between the source and drain and thereby enhances the carrier mobility.

The embedded SiGe source and drain regions of the transistor are then implanted with dopants. In some transistor applications, the dopants are implanted more than once, and the workpiece is rotated between implantation processes. For example, transistors oriented vertically may be implanted with dopants at an angle first on one side and then the wafer is rotated 180 degrees and implanted with dopants at an angle from a second opposite side. The dopants are implanted at an angle in order to achieve implantation beneath the gate in the channel region, for example.

In some applications, some transistors on an IC are oriented in a vertical direction and other transistors are oriented in a horizontal direction. In such applications, four implantation processes may be required to implant the dopants, e.g., by implanting dopants at an angle after four 90 degree rotations of the workpiece. The rotation and implantation processes add to the cost of manufacturing and increase the time required to manufacture the semiconductor devices. Two lithography masks and lithography processes may be required, e.g., to mask the vertically oriented transistors during the dopant implantation process for the horizontally oriented transistors, and to mask the horizontally oriented transistors during the dopant implantation process for the vertically oriented transistors, which further increases the cost of manufacturing.

In addition, the implantation processes may be difficult to control and may be subject to a variety of factors such as temperature, time, and dimensions of the transistors. Furthermore, the implantation processes may alter the crystalline structure of the source and drain regions, changing properties of the transistor and relaxing the intrinsic stress induced by the eSiGe, which may decrease device performance. Reducing the stress of the eSiGe may result in a reduction of the mobility enhancement, for example.

Thus, what are needed in the art are improved methods of manufacturing transistors and structures thereof.

Embodiments of the present invention achieve technical advantages by recessing source and drain regions beneath a portion of transistor gates, so that an in-situ doped compound semiconductor material may be used to fill the source and drain regions. Because the compound semiconductor material extends slightly beneath the transistor gates, subsequent implantation steps at an angle are advantageously not required.

FIGS. 1 through 5 show cross-sectional views of a semiconductor device 100 at various stages of manufacturing in accordance with a preferred embodiment of the present invention. To manufacture the semiconductor device 100, first, a workpiece 102 is provided. The workpiece 102 may include a semiconductor substrate comprising silicon or other semiconductor materials and may be covered by an insulating layer, for example. The workpiece 102 may also include other active components or circuits, not shown. The workpiece 102 may comprise silicon oxide over single-crystal silicon, for example. The workpiece 102 may include other conductive layers or other semiconductor elements, e.g., transistors, diodes, etc. Compound semiconductors, GaAs, InP, Si/Ge, or SiC, as examples, may be used in place of silicon. The workpiece 102 may comprise a silicon-on-insulator (SOI) or a germanium-on-insulator (GOI) substrate, as examples.

Isolation regions 104 are formed in the workpiece 102. The isolation regions 104 may comprise shallow trench isolation (STI) regions, deep trench (DT) isolation regions, field oxide isolation regions, or other insulating regions, as examples. The isolation regions 104 may be formed by depositing a hard mask (not shown) over the workpiece 102 and forming trenches in the workpiece 102 and the hard mask using a lithography process. For example, the isolation regions 104 may be formed by depositing a photoresist, patterning the photoresist using a lithography mask and an exposure process, developing the photoresist, removing portions of the photoresist, and then using the photoresist and/or hard mask to protect portions of the workpiece 102 while other portions are etched away, forming trenches in the workpiece 102. The photoresist is removed, and the trenches are then filled with an insulating material such as an oxide or nitride, or multiple layers and combinations thereof, as examples. The hard mask may then be removed. Alternatively, the isolation regions 104 may be formed using other methods and may be filled with other materials.

A gate dielectric material 106 is deposited over the workpiece 102 and the isolation regions 104. The gate dielectric material 106 preferably comprises about 200 Angstroms or less of an oxide such as $SiO_2$, a nitride such as $Si_3N_4$, a high-k dielectric material having a dielectric constant greater than 3.9, such as $HfO_2$, $HfSiO_x$, $Al_2O_3$, $ZrO_2$, $ZrSiO_x$, $Ta_2O_5$, $La_2O_3$, nitrides thereof, $HfAlO_x$, $HfAlO_xN_{1-x-y}$, $ZrAlO_x$, $ZrAlO_xN_y$, $SiAlO_x$, $SiAlO_xN_{1-x-y}$, $HfSiAlO_x$, $HfSiAlO_xN_y$, $ZrSiAlO_x$, $ZrSiAlO_xN_y$, or combinations and multiple layers thereof, as examples. Alternatively, the gate dielectric material 106 may comprise other dimensions and materials, for example. The gate dielectric material 106 may be formed using chemical vapor deposition (CVD), atomic layer deposition (ALD), metal organic chemical vapor deposition (MOCVD), physical vapor deposition (PVD), or jet vapor deposition (JVD), as examples, although alternatively, other methods may also be used.

Figure 6:
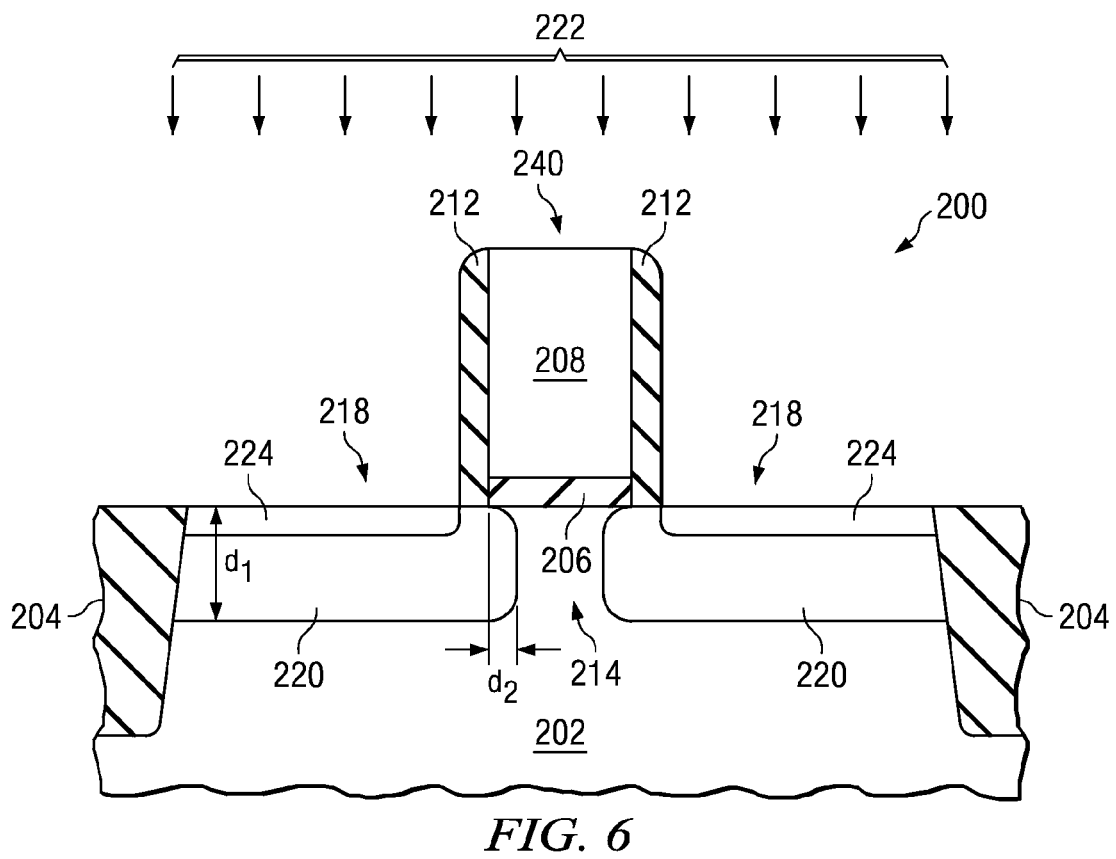
FIGS. 6 and 7 show cross-sectional views of a semiconductor device in accordance with a preferred embodiment of the present invention after shallow and deep implantation processes of the source and drain regions, respectively.
Figure 7:
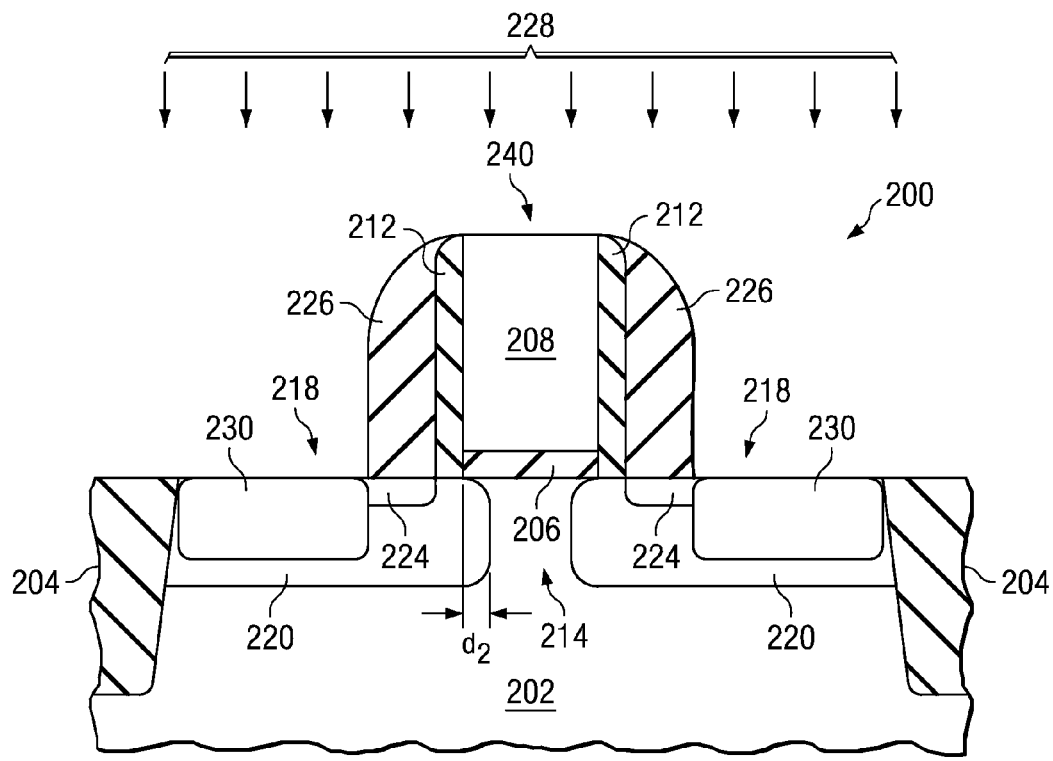

A gate material 108 is deposited over the gate dielectric material 106. The gate material 108 preferably comprises an electrode material. The gate material 108 preferably comprises a thickness of about 1,500 Angstroms or less, for example. The gate material 108 preferably comprises a semiconductor material, such as polysilicon or amorphous silicon; a metal such as TiN, HfN, TaN, W, Al, Ru, RuTa, TaSiN, $NiSi_x$, $CoSi_x$, $TiSi_x$, Ir, Y, Pt, Ti, PtTi, Pd, Re, Rh, borides, phosphides, or antimonides of Ti, Hf, Zr, TiAlN, Mo, MoN, ZrSiN, ZrN, HfN, HfSiN, WN, Ni, Pr, VN, TiW, TaC, TaCN, TaCNO, or other metals; a partially or fully silicided gate material (FUSI), having a silicide layer comprised of titanium silicide, nickel silicide, tantalum silicide, cobalt silicide, or platinum silicide; and/or combinations or multiple layers thereof, as examples. The gate material 108 may comprise a variety of different stoichiometry combinations for the components of the exemplary metals listed, for example. Alternatively, the gate material 108 may comprise other dimensions and materials, for example. The gate material 108 may be formed by CVD, PVD, or other suitable deposition methods, for example. The gate material 108 may optionally be implanted with dopants; e.g., the gate material 108 may be predoped or may be doped later, at the same time source and drain regions are implanted with dopants (e.g., as shown in FIGS. 6 and 7, to be described further herein.)

Referring again to FIG. 1, a hard mask 110 is deposited over the gate material 108. The hard mask 110 may comprise a nitride material such as silicon nitride, an oxide material such as silicon dioxide, a nitridized oxide, or multiple layers and combinations thereof, for example, although alternatively, the hard mask 110 may comprise other materials. In some embodiments, the hard mask 110 may comprise a trilayer including two nitride layers with an oxide layer disposed between the nitride layers. A plurality of alternating silicon dioxide layers and silicon nitride layers may be used for the hard mask 110, to provide etch selectivity and etch stop layers for subsequent etch processes, for example. The hard mask 110 may prevent the formation of semiconductive material in subsequent processing steps over the gate material 108, for example. The hard mask 110 preferably comprises about 500 Angstroms or less of silicon nitride and/or silicon dioxide, although alternatively, the hard mask 110 may comprise other dimensions and materials.

The hard mask 110, the gate material 108, and the gate dielectric material 106 are patterned using lithography to form a gate 108 and gate dielectric 106 with a patterned hard mask 110 residing on top. For example, a layer of photosensitive material 111 comprising a photoresist, for example, may be deposited over the hard mask 110, as shown in FIG. 1. The layer of photosensitive material 111 is patterned with the desired pattern for the gate 108 and gate dielectric 106, and the patterned layer of photosensitive material 111 and optionally also the hard mask 110 are used as a mask to pattern the gate 108 and the gate dielectric 106, as shown in phantom in FIG. 1 and leaving the patterned hard mask 110, gate 108, and gate dielectric 106 shown in FIG. 2. The layer of photosensitive material 111 is then removed.

The gate 108 may comprise a width or a gate length of about 35 to 42 nm in some embodiments, for example. The gate 108 may extend lengthwise, e.g., in and out of the paper, by about 500 nm. Alternatively, the gate 108 may comprise other dimensions depending on the particular application and the technology node used for the manufacturing of the semiconductor device 100, for example.

The workpiece 102 may be lightly doped with a dopant species to form lightly doped regions (not shown) in a top surface of the workpiece 102 proximate the gate 108 and gate dielectric 106, after the patterning of the hard mask 110, gate 108, and the gate dielectric 106. Other implantation processes (e.g., pocket implants, halo implants, or double-diffused regions) may optionally also be performed as desired after the patterning of the gate 108 and gate dielectric 106, for example. However, in accordance with some preferred embodiments of the present invention, implantation processes may not be required.

Figure 2:
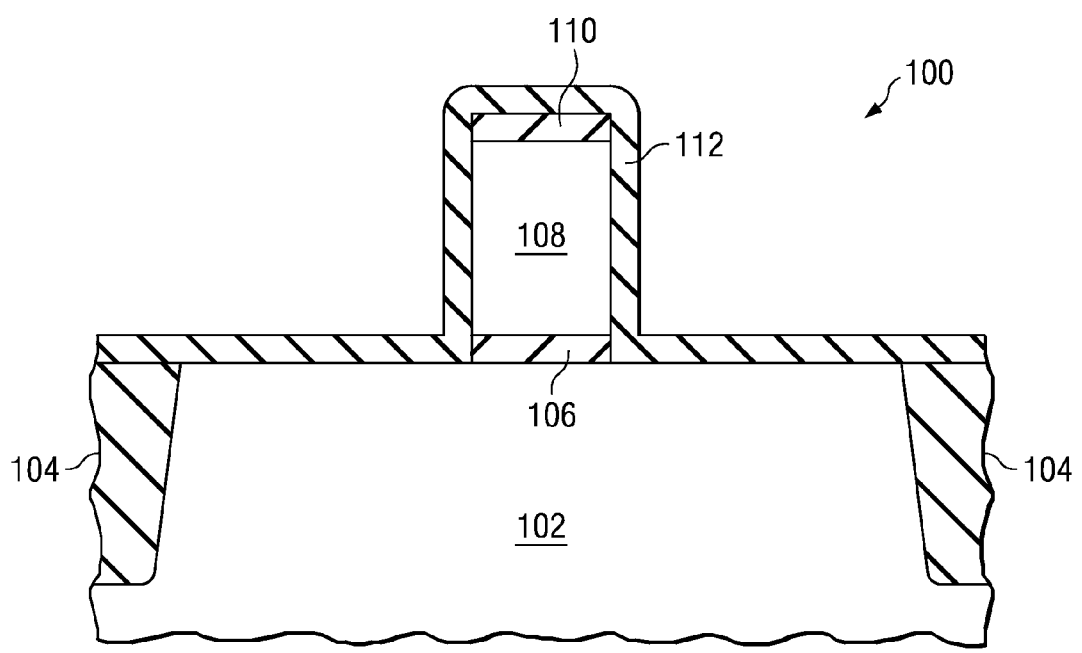

A sidewall spacer material 112 is formed over the top surface of the hard mask 110, the workpiece 102, and the isolation regions 104, and over the sidewalls of the gate 108, gate dielectric 106, and hard mask 110, as shown in FIG. 2. The sidewall spacer material 112 may comprise one or more liners and may comprise two or more layers of insulating material, e.g., such as silicon nitride, silicon oxide, and/or silicon oxynitride, although other materials may also be used. The sidewall spacer material 112 may comprise an oxide liner and a nitride layer disposed over the oxide liner, as an example. The sidewall spacer material 112 is preferably substantially conformal as-deposited, as shown in FIG. 2.

Figure 3:
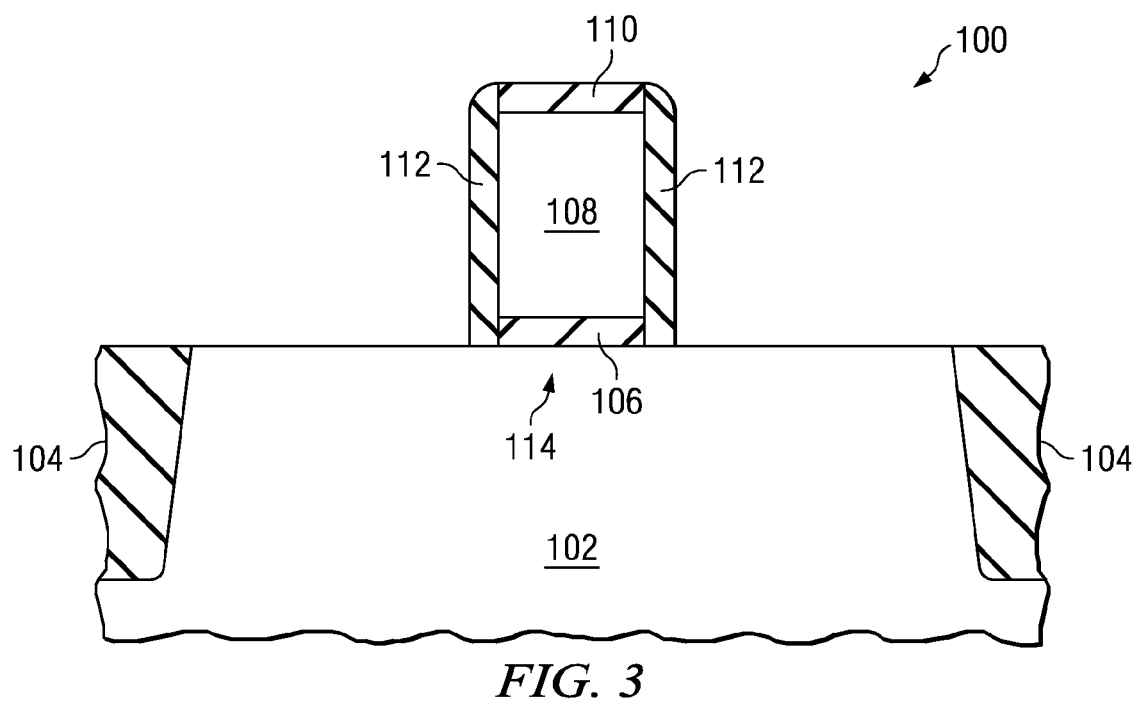

The sidewall spacer material 112 is preferably etched using an anisotropic or directional etch process, leaving sidewall spacers 112 on the sidewalls of the gate 108, gate dielectric 106, and hard mask 110, as shown in FIG. 3. The anisotropic etch process removes the sidewall spacer material 112 from the top surfaces of the hard mask 110, the workpiece 102, and the isolation regions 104, leaving sidewall spacers 112 on the sidewalls of the hard mask 110, gate 108, and gate dielectric 106. The sidewall spacers 112 may comprise downwardly-sloping sidewalls as shown due to the anisotropic etch process, for example. The sidewall spacers 112 may comprise a thickness along the sidewalls of the gate 108 of about 100 to 120 Angstroms, although alternatively, the sidewall spacers 112 may comprise other dimensions.

After the formation of the sidewall spacers 112, which are also referred to herein as first sidewall spacers 112, optionally, the workpiece 102 may be implanted with a deep implantation of a dopant species proximate the first sidewall spacers 112, not shown. The first sidewall spacers 112 may comprise temporary sidewall spacers that are later removed and replaced with permanent first sidewall spacers 112 that remain in the structure in some embodiments, for example. Alternatively, the first sidewall spacers 112 may comprise permanent sidewall spacers, as another example. A channel region 114 is formed in the workpiece 102 beneath the gate 108, e.g., beneath the gate dielectric 106.

Figure 4:
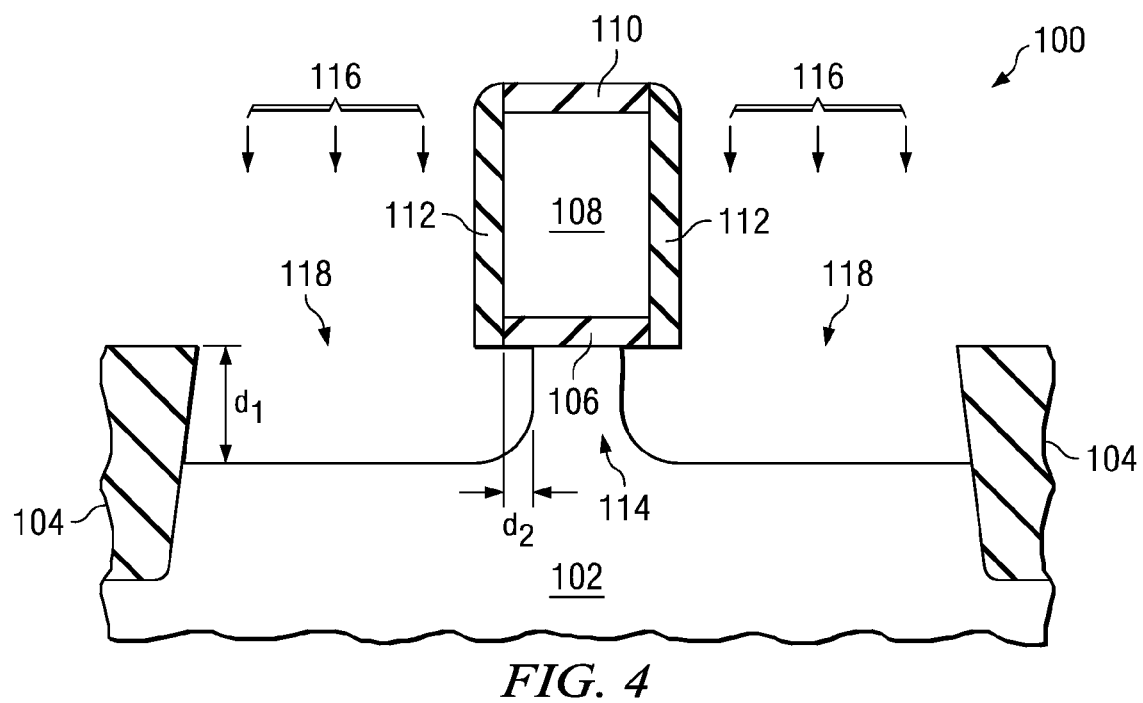

In accordance with preferred embodiments of the present invention, exposed portions of the workpiece 102 are then recessed using an etch process 116, as shown in FIG. 4. The etch process 116 preferably includes at least one isotropic or non-directional component, for example, so that the workpiece 102 is etched completely beneath the first sidewall spacers 112 and also etched partially beneath the gate 108, as shown.

The etch process 116 may comprise a single etch process comprising an isotropic component in accordance with some embodiments of the present invention. The etch process 116 may comprise a wet or dry etch process, or combinations thereof, for example. The etch process 116 may comprise a reactive ion etch (RIE) process, as another example.

In other embodiments of the present invention, the etch process 116 may comprise a two-step etch process comprising a first etch process and a second etch process. For example, the first etch process may comprise an anisotropic etch process, and the second etch process may comprise an isotropic etch process. The etch process 116 may comprise first, using the anisotropic etch process, and second, using the isotropic etch process, in some embodiments. However, in other embodiments, the etch process 116 may comprise first, using the isotropic etch process, and second, using the anisotropic etch process, for example. The etch process 116 may alternatively comprise two or more different etch processes, wherein at least one of the etch processes preferably comprises an isotropic component, as another example.

The etch process 116 is preferably adapted to remove the workpiece 102 material and not the isolation region 104 material, hard mask 110, or sidewall spacers 112, forming recesses 118 in the workpiece 102 proximate at least one side of the gate 108 and the gate dielectric 106. For example, the recesses 118 are preferably formed proximate a first side and a second side of the gate 108 and gate dielectric 106, as shown in FIG. 4. The recesses 118 preferably comprise a depth beneath the top surface of the workpiece 102 comprising a dimension $d_1$ of about 200 nm or less, for example. In some embodiments, for example, the recesses may more preferably comprise a depth or dimension $d_1$ beneath the top surface of the workpiece 102 of about 60 to 80 nm, as another example. The recesses 118 preferably comprise a width of about 900 nm to 1 µm or less in some embodiments, as another example. Alternatively, the recesses 118 may comprise other dimensions. The recesses 118 may comprise substantially oval, round, square, rectangular, triangular, or trapezoidal shapes, as examples, although alternatively, the recesses 118 may comprise other shapes.

The recesses 118 comprise two holes in the top surface of the workpiece 102 formed on both sides of the gate 108 and the gate dielectric 106. Only two recesses 118 are shown in the figures; however, alternatively, preferably a plurality of recesses 118 are simultaneously formed (e.g., a plurality of transistors are preferably formed at once across the workpiece 102).

In accordance with embodiments of the present invention, the etch process 116 preferably results in the undercutting of a portion of the gate 108, as shown. For example, the etch process 116 results in the undercutting of the workpiece 102 completely underneath the first sidewall spacers 112 and beneath a portion of the gate dielectric 106. The amount of the undercut of the workpiece 102 beneath the gate dielectric 106 and the gate 108 preferably comprises a dimension $d_2$ of at least 50 Angstroms on at least one side in some embodiments, for example. More preferably, the amount of the undercut or dimension $d_2$ of the workpiece 102 beneath the gate dielectric 106 and the gate 108 preferably comprises at least 100 to 150 Angstroms in other embodiments, for example.

Advantageously, since the etch process 116 is adapted not to remove the STI regions 104, the hard mask 110, or the sidewall spacers 112, a masking material and lithography process may not be required. Alternatively, portions of the workpiece 102 may be masked (not shown) while the region of the workpiece 102 the transistor 140 will be formed in is etched with the etch process 116, for example.

The etch process 116 used determines the shape of the recesses 118 within the top surface of the workpiece 102. For example, if a two step etch process is used, the recesses 118 comprise the shape shown in FIG. 4, wherein the directional, anisotropic etch portion of the etch process etches away the workpiece 102 preferentially in a downward direction for a portion of the etch process 116. The non-directional, isotropic etch portion of the etch process 118 results in the undercutting of the workpiece 102 beneath the sidewall spacers 112 and a portion of the gate 108. As another example, if a single etch process 116 comprising an isotropic component is used, the recesses 118 may comprise the shape of a shallow or deep bowl, and less of the workpiece 102 may be etched away near the top and bottom of the recesses 118, as illustrated in the embodiment shown in FIG. 6.

Figure 5:
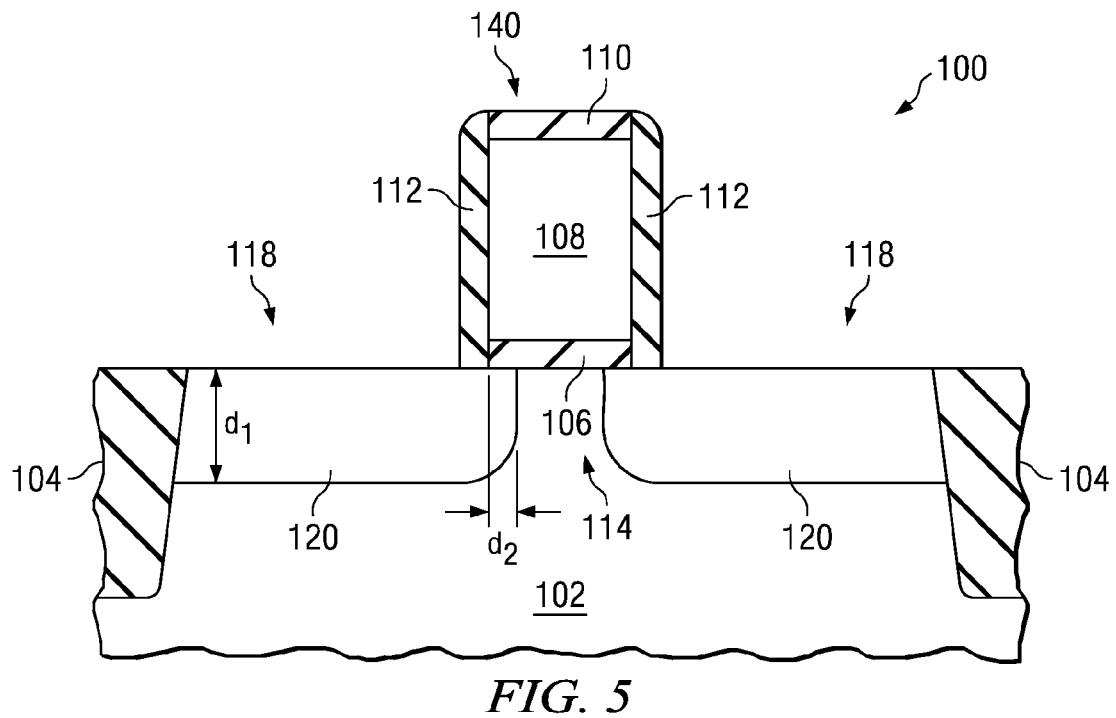

Next, in accordance with an embodiment of the present invention, the recesses 114 are filled with a semiconductive material 120, as shown in FIG. 5. The semiconductive material 120 preferably comprises and is also referred to herein as a compound semiconductor material 120. The semiconductive material 120 preferably comprises two or more semiconductor elements or a semiconductor element combined with another type of element, for example. The semiconductive material 120 preferably comprises a doped semiconductive material, as another example. In a preferred embodiment, the recesses 118 are filled using an in-situ doping process of the doped semiconductive material, e.g., wherein the semiconductive material 120 is doped as the recesses 118 are filled. In some embodiments, the semiconductive material 120 is preferably epitaxially grown and is in-situ doped during the epitaxial growth process, as another example.

The semiconductive material 120 preferably comprises SiGe, carbon-doped SiGe, or SiC, in some embodiments, although other materials may also be used. The semiconductive material 120 is preferably selected to achieve the amount and type of stress desired for the particular transistor 140 device being manufactured, for example. The semiconductive material 120 may be doped with a p-type dopant or an n-type dopant depending on the application, for example.

If the transistor 140 comprises a p channel metal oxide semiconductor (PMOS) field effect transistor (FET), filling the recesses 118 in the workpiece 102 with a semiconductive material 120 preferably comprises epitaxially growing SiGe. Filling the recesses 118 in the workpiece 102 may comprise in-situ doping the SiGe as it is deposited with an n-type dopant such as As, C, P, or combinations thereof, as examples. Alternatively, other semiconductive materials and dopant elements may also be used. The compound semiconductive material 120 increases the tensile stress of the source region and the drain region of the transistor 140 in these embodiments, which creates compressive stress on the channel region 114, for example.

As another example, if the transistor comprises an n channel metal oxide semiconductor (NMOS) field effect transistor (FET), the recesses 118 in the workpiece 102 are preferably filled with a semiconductive material 120 that preferably comprises epitaxially grown SiC that may be in-situ doped with a p-type dopant such as B. Alternatively, other semiconductive materials and dopant elements may also be used. The compound semiconductive material 120 increases the compressive stress of the source region and the drain region of the transistor 140 in these embodiments, which creates tensile stress on the channel region 114, for example.

The semiconductive material 120 preferably completely fills the recesses 118 in the entire amount of the depth beneath the top surface of the workpiece 102 comprising the dimension $d_1$ of about 200 nm or less, for example.

The semiconductive material 120 preferably comprises a compound semiconductor material comprising silicon (Si) and at least one other element, for example. The other element(s) preferably comprises an atom having a different size than Si and/or a different atom size than the material of the workpiece 102, so that stress is created in the semiconductive material 120 which is bounded by the workpiece 102 and STI regions 104, for example. The semiconductive material 120 preferably comprises a material adapted to alter a stress of the workpiece 102 in a region of the workpiece 102 proximate the semiconductive material 120 in some embodiments. In some embodiments, for example, the semiconductive material 120 is preferably adapted to alter the stress of the adjacent channel region 114 disposed between source and drain regions comprising the semiconductive material 120. The semiconductive material 120 may also comprise other materials, e.g., that may or may not affect the stress of the adjacent workpiece 102.

The semiconductive material 120 is preferably epitaxially grown in some embodiments. The semiconductive material 120 preferably forms only on the exposed, recessed surfaces of the workpiece 102 in the epitaxial growth process. Alternatively, the semiconductive material 120 may be deposited, using ALD, PVD, CVD, or other deposition methods, for example, and the semiconductive material 120 may be patterned to remove the semiconductive material 120 from over the isolation regions 104, the hard mask 110, the first sidewall spacers 112, and other undesired regions of the workpiece 102.

Advantageously, if the semiconductive material 120 is epitaxially grown, the hard mask 110 prevents the semiconductive material 120 from forming on the top surface of the gate 108, for example.

If an epitaxial process is used to form the semiconductive material 120, for example, the workpiece 102 may be placed in a processing chamber, and then gas sources may be introduced into the processing chamber to epitaxially grow the semiconductive material 120 to fill the recesses 118. A first gas source comprising Si (e.g., $SiH_4$ or $SiH_2Cl_2$) and a second gas source comprising Ge (e.g., $GeH_4$) and/or C (e.g., $CH_3Si$) may be introduced into the processing chamber to form SiGe or SiC, for example. Alternatively, other gas sources may be used, and other gases may be included in the gas mixture, such as carrier gases and dopant source gases. An example of a carrier gas is HCl and an example of a p-type dopant source is $B_2H_6$, although alternatively, other gases may be used. If a dopant source gas is not included in the gas mixture, the source and drain regions 120 may be doped later, for example, although preferably in-situ doping in used in some embodiments of the present invention.

Advantageously, if an epitaxial process is used to form the semiconductive material 120, a lithography process to remove undesired semiconductive materials 120 may be avoided, because the semiconductive material 120 only forms on the exposed portions of the workpiece 102 in the recesses 118, for example. Thus, the number of lithography steps and lithography mask sets required to manufacture the semiconductor device 100 may be reduced.

Next, the hard mask 110 may be removed, and the manufacturing process for the semiconductor device 100 is then continued to complete the fabrication of the transistor 140. For example, the workpiece 102 may be annealed to cause a portion of the dopants of the semiconductive material 120 to diffuse into the adjacent workpiece 102. As an example, the workpiece 102 may be annealed at a temperature of about 1,000 C. or greater, e.g., about 1,050 to 1,070 degrees C. for a few seconds, e.g., using a spike anneal. The anneal process may cause diffusion of the dopants of the semiconductive material 120 into the adjacent workpiece 102 by about 80 Angstroms or less, although alternatively, the anneal process may result in less or no diffusion, for example.

In some embodiments, the doping concentration of the semiconductive material 120 is not necessarily homogeneous, and rather, may be graded. For example, the dopant of the compound semiconductive material 120 may comprise a greater concentration proximate a bottom surface and sides of the source region and the drain region (e.g., comprising a stronger doping level) than proximate a central region of the source region and the drain region (e.g., comprising a lighter doping level). The doping concentration during the in-situ doping of the epitaxially grown semiconductive material 120 is preferably adjusted according to the desired capacitance levels and junction leakage currents for the semiconductor device 100. The doping concentration of the semiconductive material 120 may be different throughout the thickness of the semiconductive material 120, for example.

In some embodiments, the top surface of the semiconductive material 120 may be implanted with dopants to form pocket implants, halo implants, or double-diffused regions, for example. FIGS. 6 and 7 show cross-sectional views of a semiconductor device 200 in accordance with a preferred embodiment of the present invention after shallow and deep implantation processes of the source and drain regions, respectively. Like numerals are used for the various elements that were described in FIGS. 1 through 5. To avoid repetition, each reference number shown in FIGS. 6 and 7 is not described again in detail herein. Rather, similar materials x02, x04, x06, x08, etc . . . are preferably used to describe the various material layers shown as were used to describe FIGS. 1 through 5, where x=1 in FIGS. 1 through 5 and x=2 in FIGS. 6 and 7. As an example, the preferred and alternative materials and dimensions described for the semiconductive materials 120 in the description for FIGS. 1 through 5 are preferably also used for semiconductive material 220 shown in FIGS. 6 and 7.

Referring to FIG. 6, after the etch process to recess the source and drain regions, which undercuts the gate 108 by an amount $d_2$, the recesses are filled with the doped compound semiconductive material 220. Note that in the embodiment shown, the sidewalls of the recesses proximate the channel region 214 are curved inwardly. The amount of the undercut may have a maximum amount $d_2$ at the widest portion of the curve in the sidewall of the recess, as shown. Thus, the amount of the undercut beneath the gate 208 may be less than amount $d_2$ proximate the top and bottom of the recess 218, as shown. This shape of a recess 218 may occur when the etch process (e.g., the etch process 116 shown in FIG. 4) has a relatively strong isotropic component, for example.

After the recesses 218 are filled with the semiconductive material 220, the workpiece 202 is exposed to a shallow implantation process 222, as shown in FIG. 6. The shallow implantation process 222 results in the formation of a shallow implantation region 224 of dopants in a top surface of the semiconductive material 220, e.g., within about the top 20 to 30% of the semiconductive material 220. The shallow implantation process 222 preferably results in regions 224 within the semiconductive material 220 that comprise a relatively low series resistance in some embodiments, for example.

Second sidewall spacers 226 comprising similar materials described for the first sidewall spacers 112 in FIGS. 2 through 5 (e.g., shown as first sidewall spacers 212 in FIG. 6) are formed over the first sidewall spacers 212, using similar methods described herein for the first sidewall spacers 112, as shown in FIG. 7.

Next, the workpiece 202 may be exposed to a deep implantation process 228, as shown in FIG. 7. The deep implantation process 228 results in the formation of a deep implantation region 230 of dopants into the semiconductive material 220, e.g., within about 80% of the semiconductive material 220, as shown. The deep implantation region 230 extends through a portion of the shallow implantation region 224, as shown.

The shallow and deep implantation processes 222 and 228 are preferably substantially anisotropic, being directionally preferential towards the horizontal surface of the workpiece 202, for example. Advantageously, because the semiconductive material 220 extends beneath a portion of the gate 208, a need for two or more angled dopant implantation steps is avoided in accordance with embodiments of the present invention.

Note that in some embodiments, the isolation regions 104 and 204 may be recessed below the top surface of the workpiece 102 and 202, not shown in the drawings.

Although a shallow implantation process 222 and optionally a deep implantation process 228 may be required in some application, because an angled dopant implantation process is not required, damaging the semiconductive material 220 is avoided, which may relax the intrinsic stress of the epitaxially grown compound semiconductive material 220, for example. Because the semiconductive material 220 is doped during the growth process, damage to the stress property is avoided, resulting in improved performance of the transistor 240.

The manufacturing process for the semiconductor device is then continued to complete the fabrication of the device. For example, in FIG. 8, a cross-sectional view of a portion of a completed semiconductor device 300 is shown. Again, like numerals are used for the various elements in FIG. 8 that were used to describe the previous figures, and to avoid repetition, each reference number shown in FIG. 8 in not described again in detail herein.

Second sidewall spacers 326 comprising similar materials and/or liners as described for the first sidewall spacers 312 (e.g., first sidewall spacers 112 shown in FIGS. 2 through 5) are formed over the first sidewall spacers 312, using a similar method described for the first sidewall spacers 312. The second sidewall spacers 326 may comprise an oxide liner and a nitride material disposed over the oxide liner, for example.

The semiconductive material 320 on either side of the gate dielectric 306 and the gate 308 form the source and drain regions 320 of the transistor 340. Doped or implanted portions of the workpiece 302 (not shown) proximate the semiconductive material 320 may also comprise a part of the source and drain regions, for example. A channel region 314 of the transistor 340 is located beneath the gate dielectric 306 between the source region and the drain regions.

Figure 8:
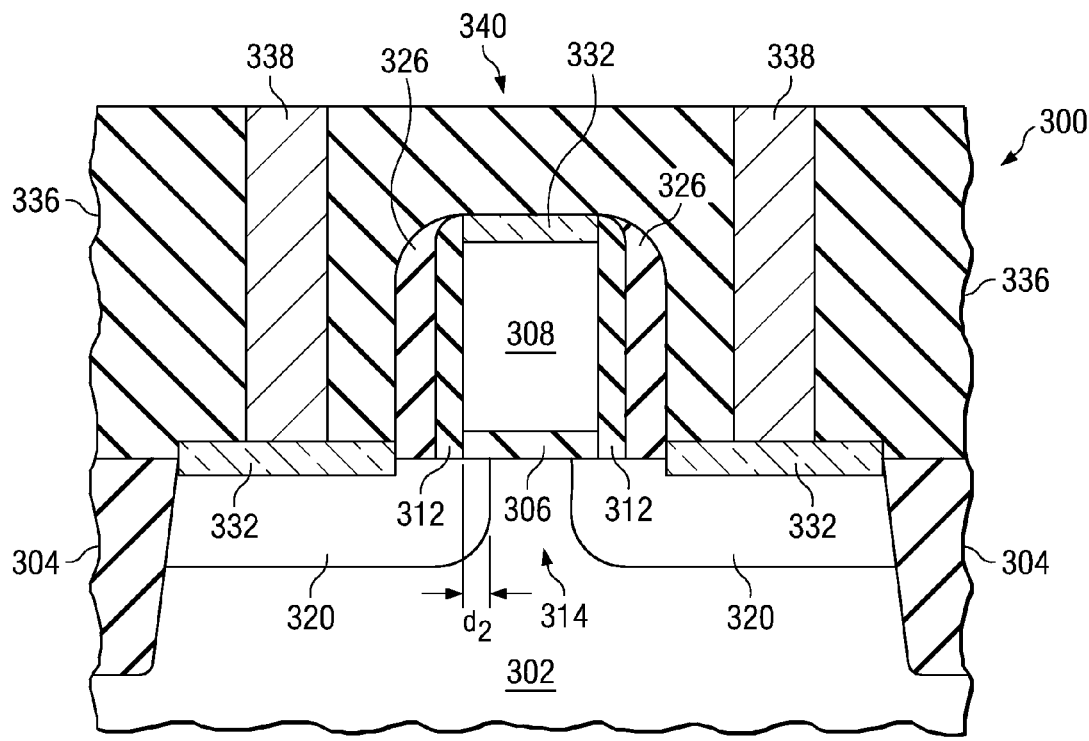
FIG. 8 shows a cross-sectional view of a semiconductor device in accordance with a preferred embodiment after the formation of second sidewall spacers and a silicide, and after further manufacturing steps to form contacts that make electrical contact to the transistor source and drain regions.

A silicide region 332 may be formed over the source and drain regions, e.g., over the semiconductive material 320, as shown in FIG. 8. The silicide region 332 may be formed by depositing a silicidation metal over the source and drain regions, e.g., over all exposed surfaces of the structure, and then subjecting the workpiece 302 to an annealing process. The hard mask 110 (not shown in FIG. 8; see FIG. 2) may be removed from over the gate 308 so that a silicide region 332 also forms over the gate 308, as shown. The silicidation metal may comprise nickel, cobalt, copper, molybdenum, titanium, tantalum, tungsten, erbium, zirconium, platinum, or combinations thereof, as examples. After the metal is deposited over at least the source and drain region and optionally also over the gate 308, the workpiece 302 is heated, causing the metal to diffuse into semiconductive material 320 and the gate 308. A silicide region 332 comprising a silicide of the metal is formed over the semiconductive material 320, as shown. After the silicide region 332 is formed, the layer of silicidation metal is then removed from the semiconductor device 300. The silicide regions 334 improve the conductivity and reduce the resistance of the source and drain regions and optionally also the gate 308, for example. The silicide 332 may partially consume the underlying semiconductive material 320, as shown.

Figure 9:
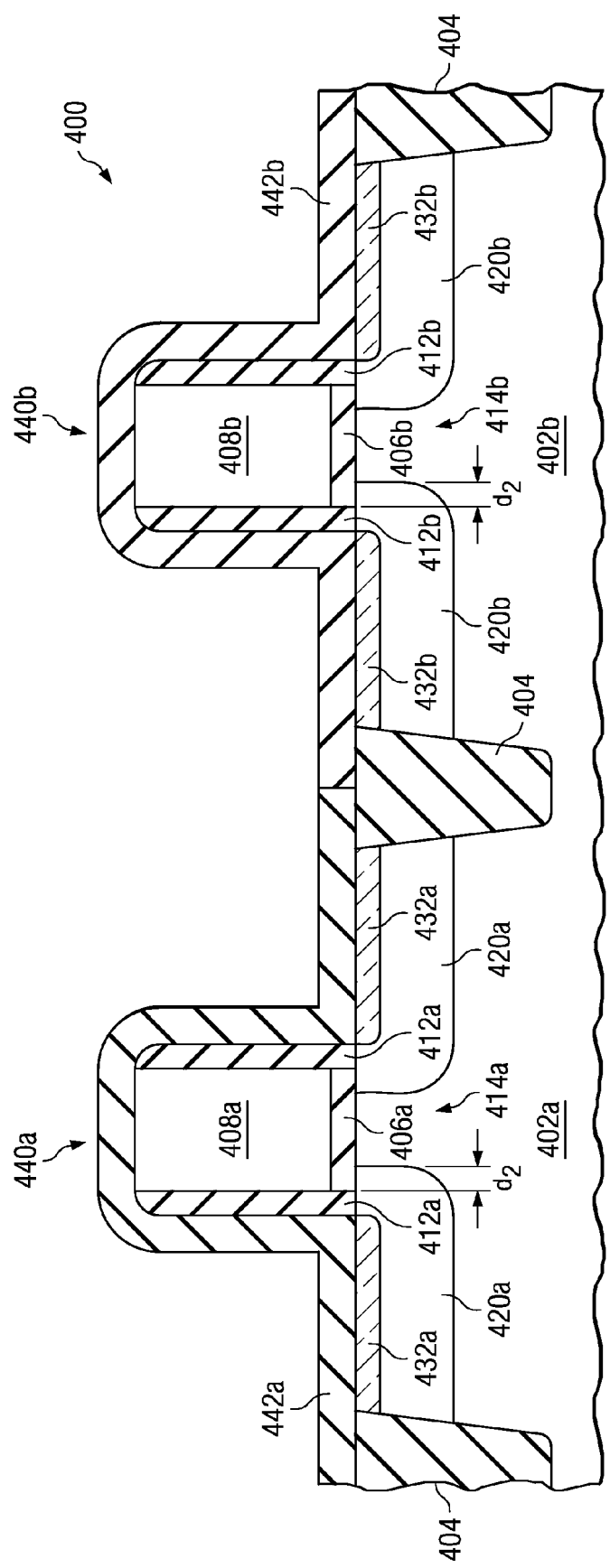
FIG. 9 is a cross-sectional view of embodiments of the present invention implemented in both an n channel metal oxide semiconductor (NMOS) and a p channel metal oxide semiconductor (PMOS) FET of a CMOS device.

An optional stress-inducing nitride layer which may also function as a contact etch stop layer may be formed over the transistor 340 at this point (not shown in FIG. 8; see FIG. 9 at 442a and 442b). An interlayer dielectric (ILD) layer 336 is then formed over the nitride layer. The ILD layer 336 preferably comprises an insulating material, and preferably comprises a material such as borophosphosilicate glass (BPSG), phosphosilicate glass (PSG), boron-doped silicon glass (BSG), organo-silicate glass (OSG), fluorinated silicate glass (FSG), spun-on-glass (SOG), silicon nitride, silicon dioxide, or plasma enhanced tetraethyloxysilane (PETEOS), as examples, although alternatively, the ILD layer 336 may comprise other materials.

The ILD layer 336 is etched to form contact holes using lithography, and source and drain contacts 338 are formed through the ILD layer 336 by depositing conductive material to fill the contact holes and make electrical contact to the silicided 332 source/drain regions 320. Note that the semiconductor device 300 also includes metallization layers (not shown) disposed above the ILD layer 336 and the source and drain contacts 338 that interconnect the various components of the semiconductor device 300. Other insulating materials and conductive materials may be formed over the transistor 340 and may be patterned to make electrical contact to portions of the transistor 340, for example, not shown. The semiconductor device 300 may be annealed to activate the dopants implanted during the various implantation steps, for example.

Embodiments of the present invention may be implemented in PMOS transistors 140, 240, and 340. In these embodiments, the semiconductive material 120, 220, and 320 preferably comprises SiGe doped with As, P, C, or combinations thereof, which introduce or increase tensile stress of the source and drain regions. Increasing the tensile stress of the source and drain regions creates compressive stress on the channel regions 114, 214, and 314 and improves device 100, 200, and 300 performance.

Embodiments of the present invention may also be implemented in NMOS transistors 140, 240, and 340. In these embodiments, the semiconductive material 120, 220, and 320 preferably comprises SiC doped with B, which introduces or increases compressive stress of the source and drain regions. Increasing the compressive stress of the source and drain regions creates tensile stress on the channel regions 114, 214, and 314 and improves device 100, 200, and 300 performance.

Embodiments of the present invention may also be implemented in a CMOS device, on either the PMOS FET or the NMOS FET, or both, of a CMOS device. FIG. 9 illustrates a cross-sectional view of embodiments of the present invention implemented in both an NMOS and a PMOS FET of a CMOS device. Again, like numerals are used for the various elements that were used to describe the previous figures, and to avoid repetition, each reference number shown in FIG. 9 is not described again in detail herein.

One transistor, e.g., transistor 440a, may be masked while the other transistor 440b is processed. Likewise, transistor 440b may be masked while the other transistor 440a is processed. In some embodiments, both transistors 440a and 440b may be processed simultaneously, for example. Optional masking and/or stress-inducing materials such as material layers 442a and 442b may be formed over the transistors 440a and 440b, for example.

In some embodiments, for example, the CMOS device 400 preferably comprises a PMOS FET 440a that preferably comprises a semiconductive material 420a comprising SiGe doped with As, P, and/or C, which increase tensile stress of the source and drain regions and increases compressive stress on the channel region 414a, which is surrounded on either side by and adjacent to the source and drain regions comprised of semiconductive material 420a. The CMOS device 400 preferably comprises an NMOS FET 440b that preferably comprises a semiconductive material 420b comprising SiC doped with B, which increases compressive stress of the source and drain regions comprised of semiconductive material 420b and increases tensile stress on the channel region 414b. The semiconductive materials 420a and 420b may be silicided by silicide regions 432a and 432b, respectively.

Note that in some embodiments, if the semiconductive materials 420a and 420b are silicided, preferably the silicide regions 432a and 432b do not extend above a top surface of the workpiece 402 along sidewalls of the sidewall spacers 412a and 412b.

Note also that in this embodiment, the device 400 may include stress liners 442a and 442b formed over the PMOS transistor 440a and the NMOS transistor 440b, respectively, to further create stress on the transistors 440a and 440b, respectively. The stress liners 442a and 442b preferably create different types of stress on the transistors 440a and 440b, for example. Liner 442a preferably contains compressive stress and liner 442b preferably contains tensile stress, for example. The various types of stress may be created in a nitride material such as silicon nitride by changing the deposition temperature and various processing conditions, for example.

In some embodiments, to manufacture a CMOS device 400 such as the one shown in FIG. 9, an NMOS transistor 440b region may be covered with a masking material (not shown) while a PMOS transistor 440a region is processed in accordance with embodiments of the present invention. Likewise, the PMOS transistor 440a region may be covered with a masking material while the NMOS transistor 440b region is processed (not shown). The masking material may comprise a disposable spacer comprising a nitride material, for example, although other materials may also be used.

Embodiments of the present invention may be implemented in applications where transistors are used, as described herein and shown in the figures. One example of a memory device that embodiments of the present invention may be implemented in that uses both PMOS FET's and NMOS FET's is a static random access memory (SRAM)

device. A typical SRAM device includes arrays of thousands of SRAM cells, for example. Each SRAM cell may have four or six transistors (for example). A commonly used SRAM cell is a six-transistor (6T) SRAM cell, which has two PMOS FET's interconnected with four NMOS FET's. The novel methods of forming source and drain regions and structures thereof described herein may be implemented in the transistors of SRAM devices and other memory devices, for example.

Embodiments of the present invention are preferably implemented in transistors wherein the source and drain regions are formed using an "early eSiGe" process. For example, in an "early eSiGe" process, the source and drain regions are recessed and filled with a semiconductive material 120/220/320/420a/420b after the formation of first sidewall spacers 112/212/312/412a/412b. The first sidewall spacers 112/212/312/412a/412b may comprise disposable spacers that are replaced later with permanent first sidewall spacers 112/212/312/412a/412b, or the first sidewall spacers 112/212/312/412a/412b may comprise permanent spacers that are left remaining in the structure, for example.

Embodiments of the present invention include semiconductor devices and transistors that include a semiconductive material formed in source and drain regions, wherein the semiconductive material undercuts the gate. Embodiments of the present invention also include methods of fabricating the semiconductor devices 100, 200, 300, and 400 and transistors 140, 240, 340, 440a, and 440b described herein, for example.

Advantages of embodiments of the invention include providing novel structures and methods for forming source and drain regions of transistors 140, 240, 340, 440a, and 440b. The semiconductive material 120, 220, 320, 420a, and 420b may be adapted to alter the stress of channel regions 114, 214, 314, 414a, and 414b of transistors 140, 240, 340, 440a, and 440b, by altering the stress of source and drain regions of transistors 140, 240, 340, 440a, and 440b using the semiconductive material 120, 220, 320, 420a, and 420b, which also improves the transistor 140, 240, 340, 440a, and 440b and device performance.

Embodiments of the present invention are easily implementable in existing manufacturing process flows, with a small or reduced number of additional processing steps being required, particularly if the semiconductive material 120, 220, 320, 420a, and 420b is formed using in-situ epitaxial growth processes, for example.

The need to implant dopant materials at an angle to form diffusion regions beneath the gate is avoided by the use of the present invention, due to the novel etch process 116 of the source and drain regions, which undercuts the gate 108, 208, 308, 408a, and 408b.

The semiconductive material 120, 220, 320, 420a, and 420b functions as a halo dose to control the short channel device threshold voltage $V_t$. The undercut of the gate 108, 208, 308, 408a, and 408b and in-situ doping of the semiconductive material 120, 220, 320, 420a, and 420b emulates a conventional angled halo implantation process yet advantageously avoids angled implantation damage to the stress properties of the device.

Implant-related stress relaxation is avoided, and the need for orientating gate electrodes during rotations and angled implantation processes is eliminated in accordance with embodiments of the present invention.

The novel shape of the undercut of the compound semiconductive material 120, 220, 320, 420a, and 420b that is preferably in-situ doped in accordance with some embodiments of the present invention results in the ability to have improved control of the threshold voltage $V_t$ of the transistors 140, 240, 340, 440a, and 440b. The semiconductive material 120, 220, 320, 420a, and 420b comprising the stress that it is desired to introduce to the channel region 114, 214, 314, 414a, and 414b is advantageously placed closer to the channel region 114, 214, 314, 414a, and 414b by the novel etch process 116 that produces the gate 108, 208, 308, 408a, and 408b undercut and by the formation of the in-situ doped semiconductive material 120, 220, 320, 420a, and 420b.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of manufacturing a semiconductor device, the method comprising:
    providing a semiconductor wafer;
    forming a gate dielectric over the semiconductor wafer;
    forming a gate over the gate dielectric;
    forming at least one recess in the semiconductor wafer proximate the gate and the gate dielectric, at least a portion of the at least one recess extending beneath the gate;
    filling the at least one recess in the semiconductor wafer with a semiconductive material of a first conductivity type; and
    forming a doped region of a second conductivity type within the semiconductive material after filling the at least one recess, the second conductivity type being opposite to the first conductivity type, the doped region forming a source/drain of a transistor.

2. The method according to claim 1, wherein forming source/drain regions comprises doping a region of the semiconductive material to form a p/n junction within the semiconductive material.

3. The method according to claim 1, wherein forming the at least one recess comprises recessing the semiconductor wafer by at least 50 Angstroms beneath the gate on at least one side.

4. The method according to claim 1, wherein filling the at least one recess comprises forming a compound semiconductor material.

5. The method according to claim 1, wherein filling the at least one recess comprises in-situ doping the semiconductive material during the filling.

6. The method according to claim 5, further comprising annealing the semiconductor wafer, causing dopants of the doped semiconductive material to diffuse into the semiconductor wafer.

7. A method of manufacturing a semiconductor device, the method comprising:
forming a gate dielectric over a workpiece;
forming a gate over the gate dielectric;
forming at least one recess in the workpiece proximate the gate, wherein the at least one recess extends beneath a portion of the gate;
epitaxially growing a semiconductive material in the at least one recess to fill the at least one recess, the semiconductive material comprising a first doping type after the epitaxial growth; and
forming a doped region of a second doping type, the second doping type being opposite to the first doping type, the doped region being fully disposed within the semiconductive material and forming a source/drain of a transistor.

8. The method according to claim 7, further comprising forming a silicide over at least the semiconductive material.

9. The method according to claim 7, wherein forming the at least one recess comprises a single etch process, wherein the etch process comprises an isotropic component.

10. The method according to claim 7, wherein forming the at least one recess comprises a first etch process and a second etch process, wherein the first etch process comprises an anisotropic etch process, and wherein the second etch process comprises an isotropic etch process.

11. The method according to claim 10, wherein forming the at least one recess comprises first, using the first etch process, and second, using the second etch process.

12. The method according to claim 10, wherein forming the at least one recess comprises first, using the second etch process, and second, using the first etch process.

13. The method according to claim 7, further comprising forming a hard mask over the gate.

14. A method of manufacturing a transistor, the method comprising:
forming a gate dielectric material over a workpiece;
forming a gate material over the gate dielectric material;
patterning the gate material and the gate dielectric material to form a gate and a gate dielectric, the gate and the gate dielectric comprising sidewalls;
forming at least one sidewall spacer over the sidewalls of the gate and the gate dielectric;
forming recesses in the workpiece proximate the at least one sidewall spacer, the recesses extending beneath a portion of the gate; and
filling the recesses in the workpiece with a semiconductive material, the semiconductive material comprising a first doping type after the epitaxial growth; and
after filling the recesses, forming a source/drain of the transistor by implanting dopants of a second doping type into the semiconductive material to form an implanted region, the second doping type being opposite to the first doping type, the implanted region being fully disposed within the semiconductive material.

15. The method according to claim 14, wherein filling the recesses in the workpiece with the semiconductive material comprises forming SiGe, carbon-doped SiGe, or SiC.

16. The method according to claim 14, wherein forming the at least one sidewall spacer comprises:
forming first sidewall spacers over the sidewalls of the gate and gate dielectric, before forming recesses in the workpiece proximate the at least one sidewall spacer; and
forming second sidewall spacers over the first sidewall spacers, after filling the recesses in the workpiece with the semiconductive material.

17. The method according to claim 16, wherein implanting dopants of a second doping type into the semiconductive material comprises:
forming shallow implantation regions in a top surface of the semiconductive material, after forming the first sidewall spacers; and
forming deep implantation regions in the semiconductive material, after forming the second sidewall spacers.

18. The method according to claim 14, wherein forming the at least one sidewall spacer comprises:
forming temporary sidewall spacers over the sidewalls of the gate and gate dielectric, before filling the recesses in the workpiece with the semiconductive material;
removing the temporary sidewall spacers;
forming first sidewall spacers over the sidewalls of the gate and gate dielectric; and
forming second sidewall spacers over the first sidewall spacers.

19. The method according to claim 14, wherein the transistor comprises fabricating a p channel metal oxide semiconductor (PMOS) field effect transistor (FET), and wherein filling the recesses in the workpiece with a semiconductive material comprises epitaxially growing SiGe, further comprising in-situ doping the SiGe with As, C, P, or combinations thereof.

20. The method according to claim 14, wherein the transistor comprises fabricating an n channel metal oxide semiconductor (NMOS) field effect transistor (FET), and wherein filling the recesses in the workpiece with a semiconductive material comprises epitaxially growing SiC, further comprising in-situ doping the SiC with B.

21. A method of manufacturing a transistor, the method comprising: forming a gate dielectric over a channel region, the channel region having a first conductivity type disposed within a semiconductor region and including a first side and a second side opposite the first side;
forming a gate over the gate dielectric, the gate and the gate dielectric having sidewalls; forming at least one sidewall spacer over the sidewalls of the gate and the gate dielectric; forming a source region having a second conductivity type within the semiconductor region proximate the first side of the channel region, the second conductivity type being opposite to the first conductivity type; and forming a drain region having the second conductivity type within the semiconductor region proximate the second side of the channel region, the source region arid the drain region comprising a compound semiconductive material; forming a first halo region having the first conductivity type disposed in the first side of the channel region, the first halo disposed between the source region and the first side of the channel region; forming a second halo region disposed in the second side of the channel region, the second halo disposed between the drain region and the second side of the channel region, wherein a portion of the first halo region adjacent the source region comprises the compound semiconductive material; and
wherein the compound semiconductive material is doped with a dopant, and wherein the dopant of the compound semiconductive material comprises a greater concentration proximate a bottom surface and sides of the source region and the drain region than proximate a central region of the source region and the drain region.

* * * * *